US008308898B2

(12) United States Patent
Kasai et al.

(10) Patent No.: US 8,308,898 B2
(45) Date of Patent: Nov. 13, 2012

(54) TUNER AND MICROWAVE PLASMA SOURCE

(75) Inventors: Shigeru Kasai, Nirasaki (JP); Taro Ikeda, Nirasaki (JP); Yuki Osada, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/246,417

(22) Filed: Sep. 27, 2011

(65) Prior Publication Data

US 2012/0067523 A1 Mar. 22, 2012

Related U.S. Application Data

(63) Continuation of application No. PCT/JP2010/054960, filed on Mar. 23, 2010.

(30) Foreign Application Priority Data

Mar. 27, 2009 (JP) ................................. 2009-079548

(51) Int. Cl.
*C23C 16/00* (2006.01)
*C23F 1/00* (2006.01)
*H01L 21/306* (2006.01)
*H01J 7/24* (2006.01)
*H05B 31/26* (2006.01)
*H03H 7/38* (2006.01)

(52) U.S. Cl. ....... 156/345.41; 118/723 MW; 118/723 R; 156/345.36; 315/111.21; 333/32

(58) Field of Classification Search ............. 156/345.36, 156/345.41; 118/723 MW, 723 R
See application file for complete search history.

(56) References Cited

U.S. PATENT DOCUMENTS

| 4,958,163 | A | * | 9/1990 | Leonard ........................ 343/745 |
| 5,389,153 | A | * | 2/1995 | Paranjpe et al. ....... 118/723 MP |
| 5,523,652 | A | * | 6/1996 | Sferlazzo et al. ........ 315/111.41 |
| 5,869,817 | A | * | 2/1999 | Zietlow et al. ................ 219/696 |
| 6,621,372 | B2 | * | 9/2003 | Kondo et al. .................... 333/35 |
| 6,856,211 | B2 | | 2/2005 | Yamada et al. |

(Continued)

FOREIGN PATENT DOCUMENTS

JP 07-153599 * 11/1993

(Continued)

OTHER PUBLICATIONS

English Machine Translation JP7153599, Takasuka et al dated Jun. 16, 1995.*

(Continued)

*Primary Examiner* — Rakesh Dhingra
(74) *Attorney, Agent, or Firm* — Oblon, Spivak, McClelland, Maier & Neustadt, L.L.P.

(57) ABSTRACT

A tuner for matching impedance includes: a body having a tubular outer conductor and a tubular inner conductor coaxially provided in the outer conductor, the body forming a part of the microwave transmission path; an annular dielectric slug provided between the outer conductor and the inner conductor, the slug being movable along a longitudinal direction of the inner conductor; and a drive mechanism for moving the slug and including a drive part for applying a driving force; a drive transmission part for transmitting the driving force to the slug; a drive guide part for guiding movement of the slug; and a holding part for holding the slug at the drive transmission part, and wherein the drive transmission part, the drive guide part and the holding part are accommodated in the inner conductor.

10 Claims, 5 Drawing Sheets

U.S. PATENT DOCUMENTS

| | | |
|---|---|---|
| 2002/0148564 A1* | 10/2002 | Ishii et al. ............... 156/345.41 |
| 2005/0034815 A1* | 2/2005 | Kasai et al. ............. 156/345.41 |
| 2005/0057164 A1* | 3/2005 | Kitamura et al. ........ 315/111.21 |
| 2005/0082004 A1* | 4/2005 | Kasai ....................... 156/345.41 |
| 2006/0137613 A1* | 6/2006 | Kasai ................... 118/723 MW |
| 2007/0119376 A1* | 5/2007 | Ishii et al. ............ 118/723 MW |
| 2009/0146757 A1 | 6/2009 | Vellas et al. |
| 2009/0159214 A1 | 6/2009 | Kasai |
| 2009/0267669 A1 | 10/2009 | Kasai |

FOREIGN PATENT DOCUMENTS

| | | |
|---|---|---|
| JP | 10-150306 | 6/1998 |
| JP | 2003-347808 | * 12/2003 |
| JP | 2004-7056 | 1/2004 |
| JP | 2006-287817 | 10/2006 |
| JP | 2007-109457 | 4/2007 |
| JP | 2009-502075 | 1/2009 |
| WO | WO 2008/013112 A1 | 1/2008 |

OTHER PUBLICATIONS

English Machine Translation JP2003347808, Yamada et al dated Dec. 5, 2003.*

International Search Report mailed Jul. 13, 2010 in PCT/JP2010/054960 filed Mar. 23, 2010.

* cited by examiner

US 8,308,898 B2

TUNER AND MICROWAVE PLASMA SOURCE

This application is a Continuation Application of PCT International Application No. PCT/JP2010/054960 filed on Mar. 23, 2010, which designated the United States.

FIELD OF THE INVENTION

The present invention relates to a tuner which performs automatic impedance matching in a microwave plasma processing apparatus and a microwave plasma source.

BACKGROUND OF THE INVENTION

In processes of manufacturing a semiconductor device or a liquid display device, a plasma processing apparatus such as a plasma etching apparatus, a plasma CVD film forming apparatus or the like is used to perform plasma processing such as etching, film formation or the like on a substrate to be processed such as a semiconductor wafer, a glass substrate or the like.

Recently, as a plasma processing apparatus, an RLSA (Radial Line Slot Antenna) microwave plasma processing apparatus capable of uniformly generating a high-density plasma having a low electron temperature attracts attention (see, e.g., Japanese Patent Laid-open Publication No. 2007-109457).

In the RLSA microwave plasma processing apparatus, a planar antenna (radial line slot antenna) having a plurality of slots formed in a predetermined pattern is provided at an upper portion of a chamber. A microwave generated from a microwave generating source is radiated from the slots of the planar antenna into the chamber maintained in a vacuum state via a microwave transmitting plate made of a dielectric material and provided therebelow. A gas introduced into the chamber is turned into a plasma by an electric field of the microwave, and an object to be processed such as a semiconductor wafer or the like is processed by the plasma thus generated.

In addition, there is proposed a microwave plasma processing apparatus including a microwave plasma source in which a microwave is distributed and introduced into a chamber through a plurality of microwave introduction mechanisms having planar antennas, and then spatially compounded in the chamber (International Publication No. 2008/013112 pamphlet).

In these microwave plasma processing apparatuses, an impedance matching unit (tuner) is required to perform impedance tuning of a load (plasma). As for the impedance matching unit, there is known one using a slug tuner having a plurality of slugs (Japanese Patent Laid-open Publication No. 2003-347808 or the like).

In the slug tuner, a tube-shaped outer conductor and an inner conductor provided within the outer conductor form a coaxial microwave transmission path. Further, at least two slugs made of a dielectric material are provided in a gap between the inner surface of the outer conductor and the outer surface of the inner conductor, and movable along the longitudinal direction of the inner conductor. The impedance tuning is performed by moving the slugs by a drive mechanism. Accordingly, a compact tuner capable of reducing an amount of loss can be realized.

In this tuner, the drive mechanism for moving the slugs is provided at the outer side of the outer conductor. The drive mechanism includes a drive unit such as a motor or the like, a drive transmission unit such as a ball screw or the like, and a drive guide unit such as an LM guide or the like. Specifically, the slugs are provided with brackets which are combined to the ball screw serving as the transmission unit. The slugs are moved by rotating the ball screw by the motor and guiding brackets coupled to the ball screw by the LM guide.

When the above-described mechanism is used as a unit for driving the slug, slits through which the brackets pass need to be provided at the outer conductor, and a considerably large-sized shield mechanism is required to prevent leakage of electromagnetic waves from the slits. Further, since the drive mechanism is provided outside the outer conductor, the weight and the moment of the mechanical elements increase, which leads to requirement of a large-sized motor. Therefore, the presence of the drive mechanism limits the scaling down of the tuner.

SUMMARY OF THE INVENTION

In view of the above, the present invention provides a tuner for performing impedance matching which can be scaled down compared to a conventional tuner, and a microwave plasma source using the same.

In accordance with an aspect of the present invention, there is provided a tuner, provided in a microwave transmission path for transmitting a microwave from a microwave power source to a chamber for performing a microwave plasma process, for matching an impedance of a load in the chamber to a characteristic impedance of the microwave power source. The tuner includes: a body having a tubular outer conductor and a tubular inner conductor coaxially provided in the outer conductor, the body forming a part of the microwave transmission path; an annular dielectric slug provided between the outer conductor and the inner conductor, the slug being movable along a longitudinal direction of the inner conductor; and a drive mechanism for moving the slug.

Further, the drive mechanism includes: a drive part for applying a driving force; a drive transmission part for transmitting the driving force from the drive part to the slug; a drive guide part for guiding movement of the slug; and a holding part for holding the slug at the drive transmission part, wherein the drive transmission part, the drive guide part and the holding part are accommodated in the inner conductor.

In accordance with another aspect of the present invention, there is provided a microwave plasma source including: a microwave power source; a microwave transmission path for transmitting a microwave from the microwave power source to a chamber for performing a plasma process on a substrate; a tuner provided in the microwave transmission path, for matching an impedance of a load in the chamber to a characteristic impedance of the microwave power source; and an antenna unit for generating a plasma by radiating the microwave to the chamber.

The tuner includes: a body having a tubular outer conductor and a tubular inner conductor coaxially provided in the outer conductor, the body forming a part of the microwave transmission path; an annular dielectric slug provided between the outer conductor and the inner conductor, the slug being movable along a longitudinal direction of the inner conductor; and a drive mechanism for moving the slug, wherein the drive mechanism comprises: a drive part for applying a driving force; a drive transmission part for transmitting the driving force from the drive part to the slug; a drive guide part for guiding movement of the slug; and a holding part for holding the slug at the drive transmission part, wherein the drive transmission part, the drive guide part and the holding part are accommodated in the inner conductor.

Further, the drive mechanism includes: a sliding member inserted into the slug, the sliding member being slidable along the inner conductor while being in contact with an inner peripheral surface of the inner conductor, the sliding member having a screw hole; and a slug moving axle provided inside the inner conductor along the longitudinal direction thereof, the slug moving axle serving as a screw rod screw-coupled to the screw hole of the sliding member of the slug.

Further, the drive transmission part is a screw mechanism constituted by the slug moving axle and the sliding member; the drive guide part is a sliding guide mechanism constituted by the sliding member and the inner peripheral surface of the inner conductor; the holding part is formed by the sliding member; and the drive part has a motor for rotating the slug moving axle. Furthermore, the slug held by the sliding member is driven by rotating the slug moving axle by the motor in a state where the sliding member is guided to slide on the inner peripheral surface of the inner conductor.

BRIEF DESCRIPTION OF THE DRAWINGS

The objects and features of the present invention will become apparent from the following description of preferred embodiments, given in conjunction with the accompanying drawings, in which.

DETAILED DESCRIPTION OF THE EMBODIMENTS

Embodiments of the present invention will be described with reference to the accompanying drawings which form a part thereof.

Figure 1:
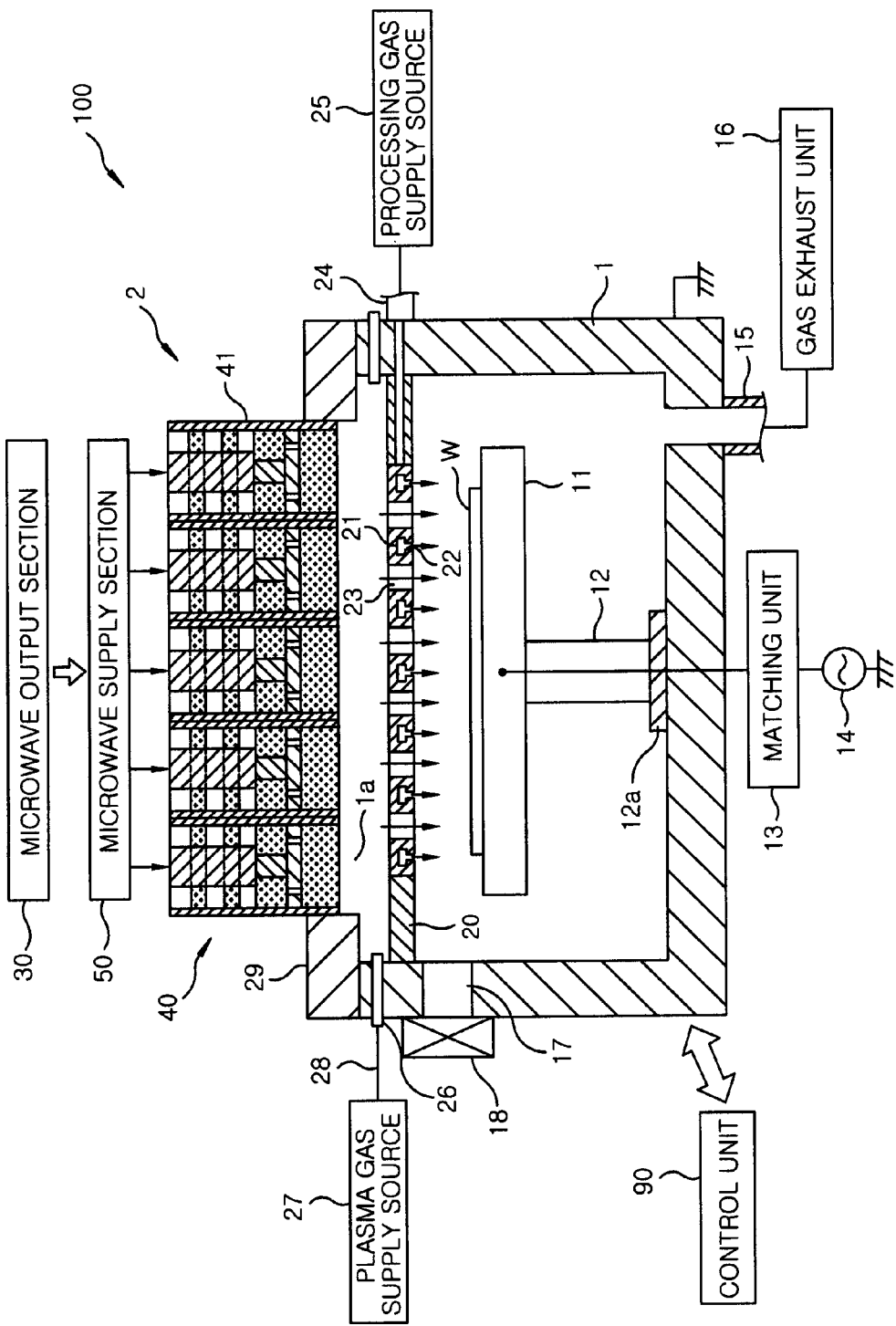
FIG. 1 is a cross sectional view showing a schematic configuration of a plasma processing apparatus including a microwave plasma source having a tuner in accordance with an embodiment of the present invention.
Figure 2:
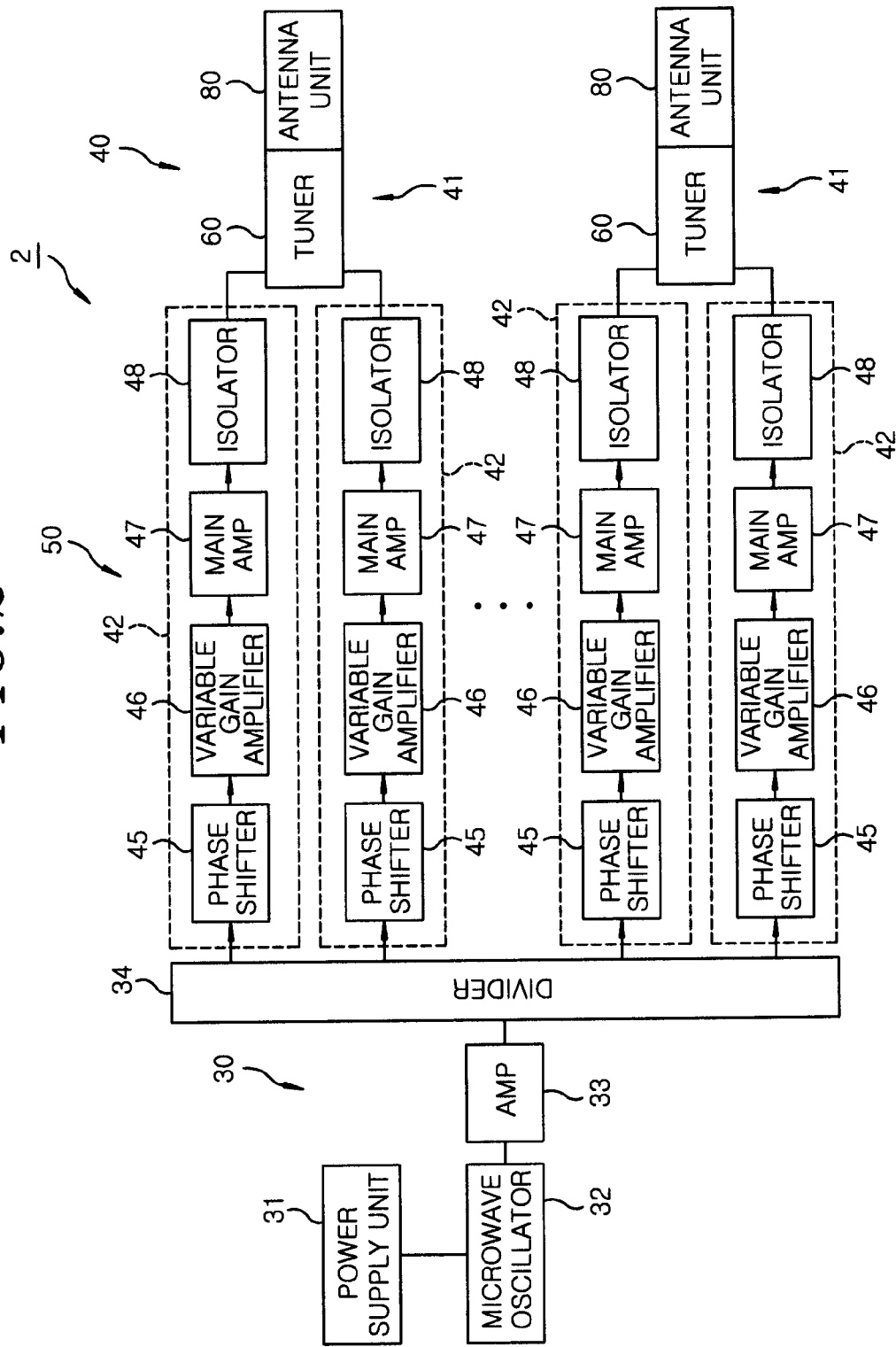
FIG. 2 is a block diagram illustrating a configuration of the microwave plasma source shown in FIG. 1.

FIG. 1 is a cross sectional view showing a schematic configuration of a plasma processing apparatus including a microwave plasma source having a microwave introducing mechanism in accordance with an embodiment of the present invention. FIG. 2 shows a configuration of the microwave plasma source shown in FIG. 1.

A plasma processing apparatus 100 is represented by a plasma etching apparatus for performing plasma processing, e.g., etching, on a wafer. The plasma processing apparatus 100 includes a substantially cylindrical airtight chamber 1 that is grounded and made of a metal material, e.g., aluminum, stainless steel or the like, and a microwave plasma source 2 for generating a microwave plasma in the chamber 1. An opening 1a is formed at an upper portion of the chamber 1, and the microwave plasma source 2 is provided at the opening 1a so as to face an inside of the chamber 1.

In the chamber 1, a susceptor 11 for horizontally supporting a wafer W as an object to be processed is supported by a cylindrical supporting member 12 installed upwardly at a center of a bottom portion of the chamber 1 with an insulating member 12a interposed therebetween. The susceptor 11 and the supporting member 12 are made of, e.g., aluminum having an alumite-treated (anodically oxidized) surface or the like.

Although it is not illustrated, the susceptor 11 is provided with an electrostatic chuck for electrostatically attracting the wafer W, a temperature control mechanism, a gas channel supplying a heat transfer gas to a backside of the wafer W, an elevating pin that is moved up and down to transfer the wafer W, and the like. Further, a high frequency bias power supply 14 is electrically connected to the susceptor 11 via a matching unit 13. By supplying a high frequency power from the high frequency bias power supply 14 to the susceptor 11, ions in the plasma are attracted to the wafer W.

A gas exhaust line 15 is connected to the bottom portion of the chamber 1, and a gas exhaust unit 16 having a vacuum pump is connected to the gas exhaust line 15. By operating the gas exhaust unit 16, the inside of the chamber 1 is exhausted and depressurized to a predetermined vacuum level at a high speed. Provided at a sidewall of the chamber 1 are a loading/unloading port 17 for loading and unloading the wafer W, and a gate valve 18 for opening and closing the loading/unloading port 17.

A shower plate 20 through which a processing gas for plasma etching is injected toward the wafer W is horizontally provided above the susceptor 11 in the chamber 1. The shower plate 20 includes grid-shaped gas channels 21 and a plurality of gas injection holes 22 formed in the gas channels 21. Spaces 23 are formed between the grid-shaped gas channels 21. A line 24 extending to the outside of the chamber 1 is connected to the gas channels 21, and a processing gas supply source 25 is connected to the line 24.

Meanwhile, a ring-shaped plasma gas introducing member 26 is provided along a chamber wall above the shower plate 20 in the chamber 1, and a plurality of gas injection holes is formed on an inner circumference of the plasma gas introducing member 26. A plasma gas supply source 27 supplying a plasma gas is connected to the plasma gas introducing member 26 by a line 28. As for a plasma gas, it is preferable to use an inert gas such as Ar, Ne, He, $N_2$ or the like.

The plasma gas introduced into the chamber 1 through the plasma gas introducing member 26 is turned into a plasma by microwave supplied from the microwave plasma source 2 into the chamber 1. The plasma thus generated, e.g., a plasma of Ar gas, passes through the spaces 23 of the shower plate 20 and excites the processing gas injected through the gas injection holes 22 of the shower plate 20. Accordingly, a plasma of the processing gas is generated.

The microwave plasma source 2 is supported by a supporting ring 29 provided at an upper portion of the chamber 1, and the gap therebetween is airtightly sealed. As shown in FIG. 2, the microwave plasma source 2 includes a microwave output section 30 for distributing and outputting a microwave to a plurality of paths, a microwave introducing section 40 for introducing the microwave into the chamber 1, and a microwave supply section 50 for supplying the microwave outputted from the microwave output section 30 to the microwave introducing section 40.

The microwave output section 30 includes a power supply unit 31, a microwave oscillator 32, an amplifier (AMP) 33 for amplifying an oscillated microwave, and a divider 34 for distributing the amplified microwave into the plurality of paths.

The microwave oscillator 32 performs, e.g., a phase locked loop (PLL) oscillation, to generate a microwave of a predetermined frequency (e.g., 2.45 GHz). The divider 34 distributes the microwave amplified by the amplifier 33 while matching the impedance between an input side and an output side to minimize the loss of the microwave. As for the frequency of the microwave, the frequency of 8.35 GHz, 5.8 GHz, 1.98 GHz or the like may be used instead of 2.45 GHz.

The microwave supply section 50 includes a plurality of amplifier unit 42 for amplifying the microwave distributed by the divider 34. Each of the amplifier unit 42 includes a phase shifter 45, a variable gain amplifier 46, a main amplifier 47 serving as a solid state amplifier, and an isolator 48.

The phase shifter 45 shifts phase of the microwave by using a slug tuner, and microwave radiation characteristics can be modulated by the phase control. For example, plasma distribution can be changed by adjusting the phase of the microwave to control directivity thereof for each of the microwave introduction mechanisms. Besides, the circular polarized waves can be obtained by shifting the phase by about 90° between adjacent the microwave introduction mechanisms as will be described later.

Further, the phase shifter 45 can be used to control delay characteristics between components in amplifiers and perform spatial compounding in a tuner. However, the phase shifter 45 may not be provided when it is unnecessary to modulate the radiation characteristics or control the delay characteristics between the components in the amplifiers.

The variable gain amplifier 46 is an amplifier for controlling plasma intensity or deviation in each of the microwave introduction mechanisms by adjusting a power level of the microwave inputted to the main amplifier 47. The distribution of the generated plasma can be varied by controlling the variable gain amplifier 46 for each of the microwave introduction mechanisms.

The main amplifier 47 constituting a solid state amplifier may include, e.g., an input matching circuit, a semiconductor amplifying device, an output matching circuit, and a high Q resonant circuit.

The isolator 48 processes a microwave reflected from the microwave introducing section 40 toward the main amplifier 47. The isolator 48 includes a circulator and dummy load (coaxial terminator). The circulator transfers the microwave reflected from an antenna unit 80 to be described later to the dummy load, and the dummy load converts the reflected microwave from the circulator into heat.

As shown in FIG. 2, the microwave introducing section 40 includes a plurality of microwave introducing mechanisms 41. Each of the microwave introducing mechanisms 41 is supplied with microwave power from two amplifier units 42, and radiates the combined microwave power.

The microwave introducing mechanism 41 combines microwave powers supplied from each of the two amplifier units 42 and radiates the combined microwave power into the chamber 1.

Figure 3:
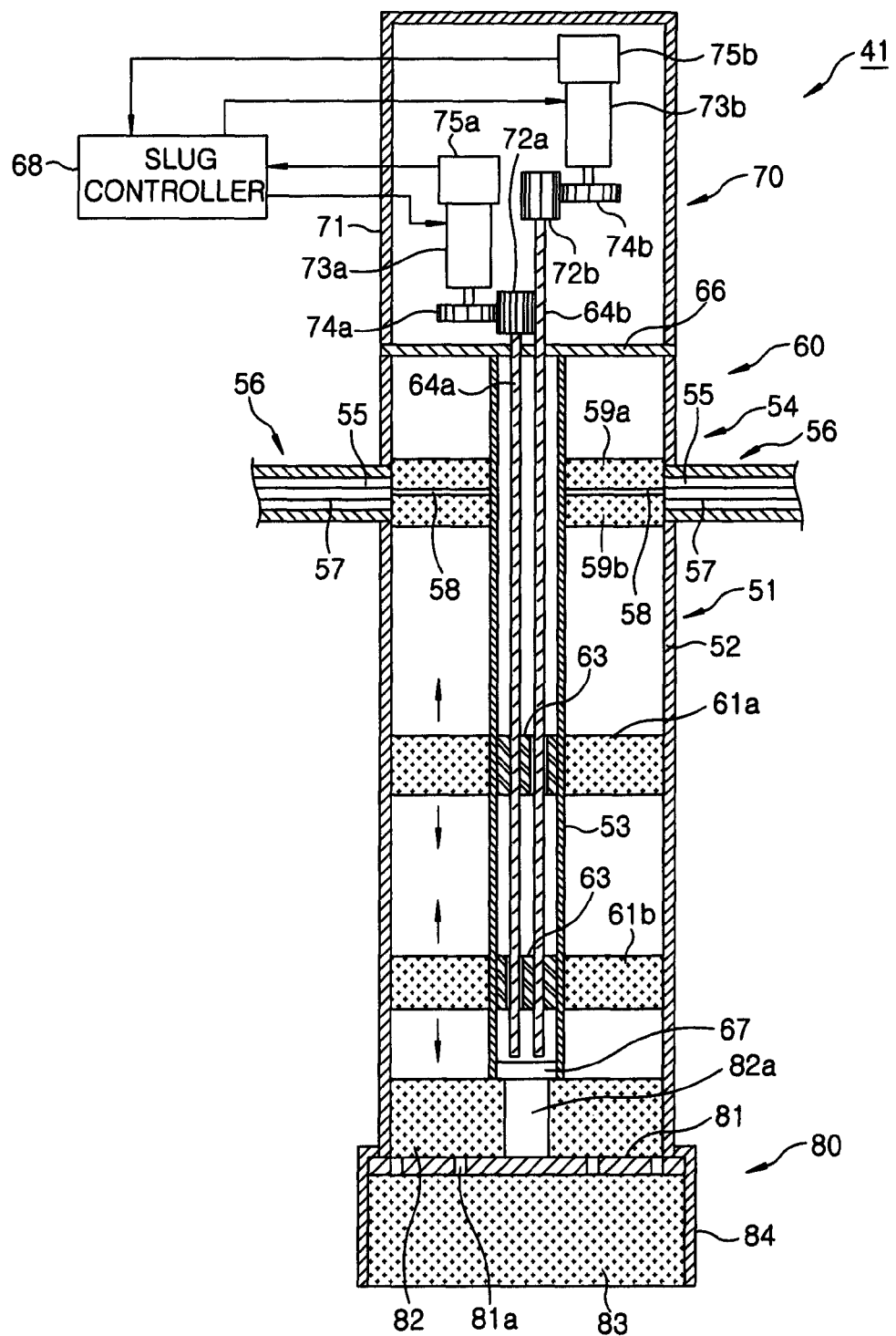
FIG. 3 is a cross sectional view presenting a microwave introducing mechanism in the microwave plasma processing apparatus shown in FIG. 1.

FIG. 3 is a cross sectional view showing the microwave introducing mechanism 41. As illustrated in FIG. 3, the microwave introducing mechanism 41 includes a tuner 60 and an antenna unit 80. The tuner 60 matches an impedance of a load (plasma) in the chamber 1 to a characteristic impedance of a microwave power source in the microwave output section 30. The tuner 60 includes a main body 51 forming a part of the microwave transmission path and having a cylindrical outer conductor 52 and a cylindrical inner conductor 53 coaxially provided in the outer conductor 52. Further, a base end portion of the main body 51 serves as a power feed/power combining unit 54. Moreover, the tuner 60 includes a slug driving unit 70 provided above the power feed/power combining unit 54.

The power feed/power combining unit 54 has, on the side surface of the outer conductor 52, two microwave power introduction ports 55 for introducing a microwave power. Coaxial lines 56 for supplying each microwave amplified by the amplifier units 42 are connected to the microwave power introduction ports 55. A power feed antenna 58 extending horizontally toward the inside of the outer conductor 52 of the main body 51 is connected to one end of an inner conductor 57 of the coaxial lines 56. The power feed antenna 58 is interposed between insulating members 59a and 59b made of a dielectric material such as quartz or the like. By radiating the microwave (electromagnetic wave) from the two power feed antennas 58, microwave power is supplied to the space between the outer conductor 52 and the inner conductor 53 and combined. The microwave power spatially combined by the power feed/power combining unit 54 propagates toward the antenna unit 80.

Circular ring-shaped two slugs 61a and 61b made of a dielectric material are provided at the antenna unit 80 side, i.e., at a portion (lower side) below the power feed/power combining unit 54 of the main body 51. The slugs 61a and 61b are provided between the outer conductor 52 and the inner conductor 53 and movable along a longitudinal direction of the main body 51. The slug 61a is provided at the slug driving unit 70 side, and the slug 61b is provided at the antenna unit 80 side. Two slug moving axles 64a and 64b for moving the slugs are formed as screw rods having, e.g., trapezoidal screws thread on surfaces thereof, and are disposed inside the inner conductor 53 along the longitudinal direction (vertical direction) thereof.

Figure 4:
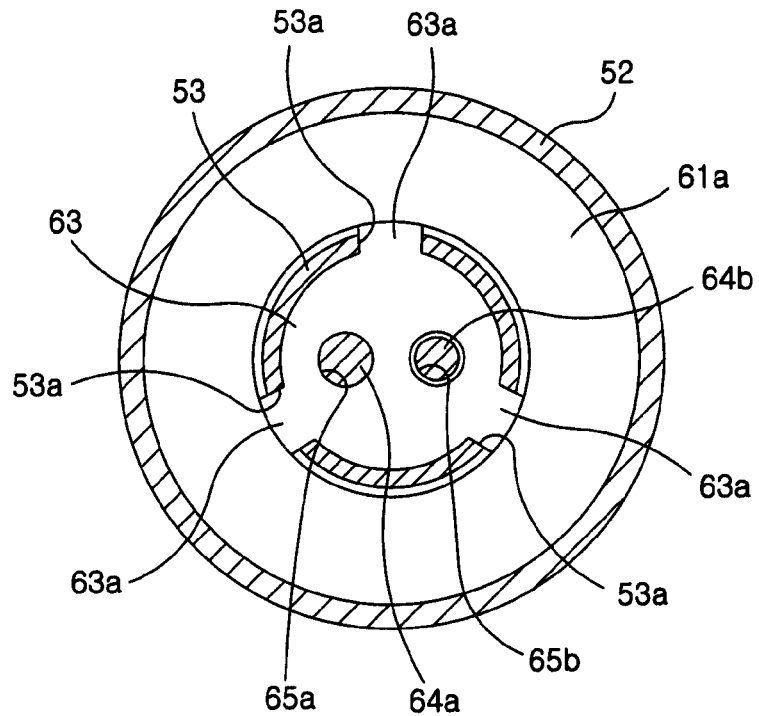
FIG. 4 is a top view showing slugs and sliding members in a main body of a tuner.

Sliding members 63 made of a resin having sliding properties are inserted into the inside of the slugs 61a and 61b. As illustrated in FIG. 4, the sliding member 63 inserted into the slug 61a is provided with a screw hole 65a to which the slug moving axle 64a is screw-coupled and a through hole 65b through which the slug moving axle 64b passes. Meanwhile, the sliding member 63 inserted into the slug 61b is provided with a screw hole 65a and a through hole 65b.

However, unlike the sliding member 63 inserted into the slug 61a, the sliding member 63 inserted into the slug 61b has the screw hole 65a screw-coupled to the slug moving axle 64b and the through hole 65b allowing the slug moving axle 64a to pass therethrough. Accordingly, the slug 61a is vertically moved by rotating the slug moving axle 64a, and the slug 61b is vertically moved by rotating the slug moving axle 64b. In other words, the slugs 61a and 61b are vertically moved by the screw mechanism including the slug moving axles 64a and 64b and the sliding members 63.

Figure 5:
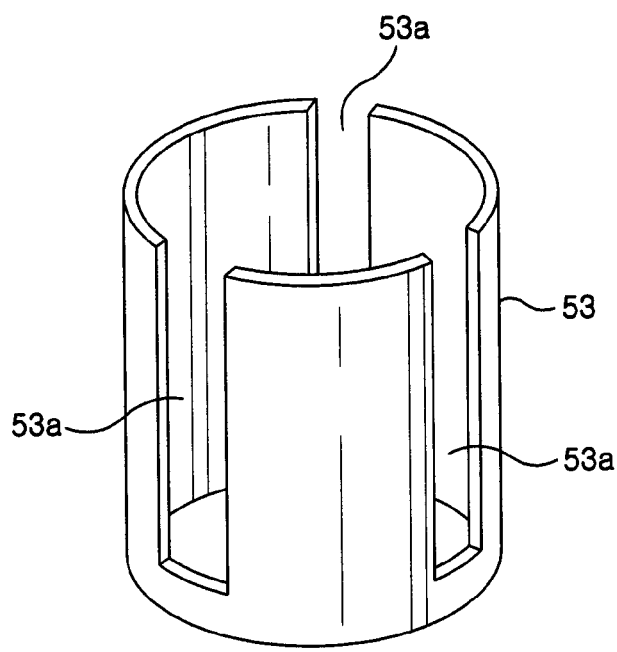
FIG. 5 is a perspective view showing a part of an internal conductor in the main body of the tuner.

As shown in FIGS. 4 and 5, the inner conductor 53 is provided with three slits 53a vertically extended and spaced apart from each other at a regular interval along the circumference. The sliding member 63 is provided with three protrusions 63a spaced apart from each other at a regular interval to correspond to the slits 53a. The sliding members 63 are inserted into the slugs 61a and 61b such that the protrusions 63a are in contact with the inner peripheries of the slugs 61a and 61b. The outer peripheral surface of the sliding member 63 contacts the inner peripheral surface of the inner conductor 53 without a gap therebetween.

When the slugs moving axles 64a and 64b rotates, the sliding members 63 vertically move while sliding along the inner conductor 53. In other words, the inner peripheral surface of the inner conductor 53 serves as a sliding guide for the slugs 61a and 61b. The slits 53a preferably have a width of about 5 mm or less. Thus, as will be described later, the microwave power that leaks into the inside of the inner conductor 53 can be substantially removed, and the radiation efficiency of the microwave power can be maintained at a high level.

As for a resin material forming the sliding members 63, it is preferable to use a comparatively easily processable resin having good sliding properties, e.g., polyphenylene sulfide (PPS) resin (Brand Name: BEAREE AS5000 (NTN Corporation)).

As shown in FIG. 3, a shield plate 66 is provided at an upper portion of the main body 51 to shield an upper opening. The slug moving axles 64a and 64b extend toward the slug driving unit 70 while penetrating the shield plate 66. Bearings (not shown) are provided between the slug moving axles 64a and 64b and the shield plate 66. Further, a bottom plate 67 made of a conductor is provided at a lower end of the inner conductor 53. Each of the slug moving axles 64a and 64b has a lower free end to absorb vibration occurring during driving. The bottom plate 67 is separated from the lower ends of the slug moving axles 64a and 64b by about 2 to 5 mm. The bottom plate 67 may be constituted by a bearing member to axially support the slug moving axles 64a and 64b.

The slug driving unit 70 has a housing 71, and the slug moving axles 64a and 64b extend in the housing 71. Gears 72a and 72b are attached to upper ends of the slug moving axles 64a and 64b. The slug driving unit 70 is provided with a motor 73a for rotating the slug moving axle 64a and a motor 73b for rotating the slug moving axle 64b. A gear 74a is attached to the axle of the motor 73a, and a gear 74b is attached to the axle of the motor 73b. The gear 74a is engaged with the gear 72a, and the gear 74b is engaged with the gear 72b. Accordingly, the slug moving axle 64a is rotated by the motor 73a via the gears 74a and 72a, and the slug moving axle 64b is rotated by the motor 73b via the gears 74b and 72b. The motors 73a and 73b are, e.g., stepping motors.

The slug moving axle 64b is longer than the slug moving axle 64a and extends further upward. Thus, the positions of the gears 72a and 72b are offset vertically, and the motors 73a and 73b are offset vertically. Hence, the space for the driving force transmission mechanism such as the motors, the gears and the like can be reduced, and the housing 71 for accommodating them can have the same diameter as that of the outer conductor 52.

Incremental encoders 75a and 75b for detecting the positions of the slugs 61a and 61b are provided above the motors 73a and 73b and are directly coupled to output axles of the motors 73a and 73b.

In general, a moving direction and a relative position of a slug can be detected by using an incremental encoder. However, with the present embodiment, an absolute position of the slug can be detected even by using the incremental encoder. A sequence thereof will be described as follows.

At First, the slug moving axle 64a is slowly rotated to move the slug 61a at a constant speed while monitoring a counter of the encoder 75a. When the slug 61a reaches a mechanical stop (not shown), the motor 73a is stepped out and stopped. The stop of the motor can be detected when the count of the encoder 75a does not change. A position of the slug 61a at that time, or a position offset therefrom by a predetermined number of pulses is regarded as a starting point. Then, the absolute position of the slug 61a can be detected by counting the number of pulses from the starting point based on the position of the starting point. The absolute position of the slug 61b can also be detected by determining the starting point. This makes a position detection sensor unnecessary.

The positions of the slugs 61a and 61b are controlled by a slug controller 68. Specifically, the slug controller 68 sends a control signal to the motors 73a and 73b based on an impedance of an input end detected by an impedance detector (not shown) and position information of the slugs 61a and 61b detected by the encoders 75a and 75b, and controls the impedance by adjusting the positions of the slugs 61a and 61b. The slug controller 68 performs impedance matching such that an impedance of a terminal becomes, e.g., about 50Ω. When only one of the two slugs is moved, the line passing through the origin of the smith chart is drawn. When both of the two slugs are moved, only the phase is rotated.

When the slug moving axles 64a and 64b have trapezoidal screw threads, the position accuracy of the slugs 61a and 61b may decrease due to backlash. However, the effect of the backlash can be avoided by applying a lifting force to the slugs 61a and 61b by, e.g., a coil spring.

The antenna unit 80 serves as a microwave radiation antenna, and includes a planar slot antenna 81 having slots 81a. The antenna unit 80 includes a wave retardation member 82 provided on a top surface of the planar slot antenna 81. A cylindrical member 82a made of a conductor is provided at a center of the wave retardation member 82 and the bottom plate 67 is connected to the planar slot antenna 81 therethrough. Accordingly, the inner conductor 53 is connected to the planar slot antenna 81 via the bottom plate 67 and the cylindrical member 82a. A lower end of the outer conductor 52 extends toward the planar slot antenna 81, and the circumference of the wave retardation member 82 is covered with the outer conductor 52. The peripheries of the planar slot antenna 81 and a ceiling plate 83 are covered with a coating conductor 84.

The wave retardation member 82 has a dielectric constant greater than that of vacuum, and is made of, e.g., a polyimide-based resin, a fluorine-based resin such as polytetrafluoroethylene, quartz, ceramics, or the like. The wave retardation member 82 has a function of making the antenna smaller by shortening the wavelength of the microwave because the wavelength of the microwave becomes longer in the vacuum. The wave retardation member 82 can adjust the phases of the microwaves depending on its thickness, and its thickness is adjusted such that an antinode of the standing wave occurs at the planar slot antenna 81. Accordingly, the radiation energy of the planar slot antenna 81 can be maximized while minimizing the reflection.

Figure 6:
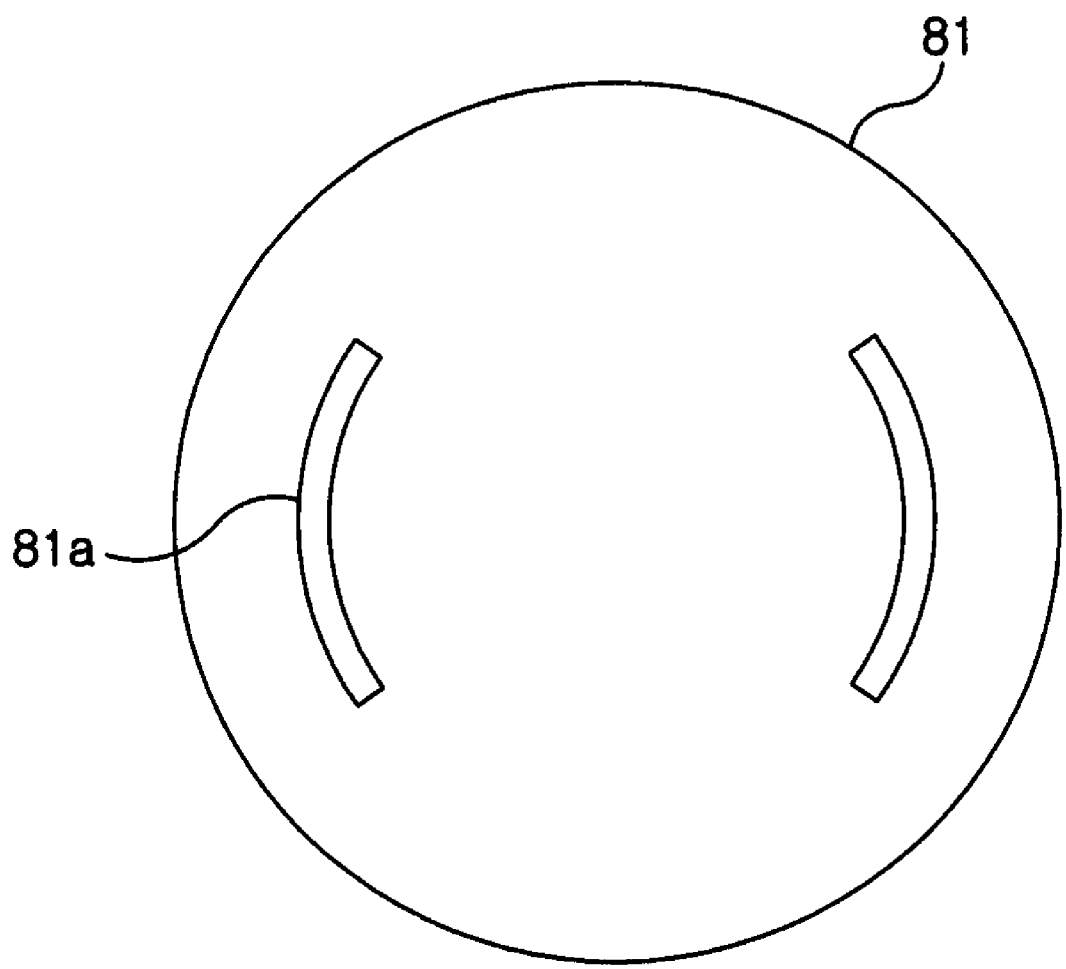
FIG. 6 is a top view representing a planar slot antenna installed at the microwave introducing mechanism.

The ceiling plate 83 is made of a dielectric member for vacuum sealing, e.g., quart, ceramic or the like, and provided at a further leading end portion of the planar slot antenna 81. The microwave amplified by the main amplifier 47 pass through the space between the inner conductor 53 and the outer conductor 52, and then are radiated into the space in the chamber 1 after transmitting through the ceiling plate 83 via the slots 81a of the planar slot antenna 81. As shown in FIG. 6, the slots 81a are preferably formed in a fan shape. The number of the slots 81a is preferably two as illustrated or four. Thus, the microwave can be effectively transmitted in a TEM mode.

In the present embodiment, the main amplifier 47, the tuner 60, and the planar slot antenna 81 are arranged close to one another. Further, the tuner 60 and the planar slot antenna 81 form a lumped constant circuit presented within ½ wavelength. Moreover, a combined resistance of the planar slot antenna 81, the wave retardation member 82, and the ceiling plate 83 are designed to be about 50Ω. Therefore, the tuner 60 can directly tune the plasma load, thereby effectively transmitting energy to the plasma.

The components in the plasma processing apparatus 100 are controlled by a control unit 90 including a micro processor. The control unit 90 includes an input device, a display, a storage unit for storing process sequences of the plasma processing apparatus 100 and process recipes as control parameters, and the like. The control unit 90 is adapted to control the plasma processing apparatus in accordance with a selected process recipe.

Hereinafter, an operation of the plasma processing apparatus 100 configured as described above will be explained.

First of all, the wafer W is loaded into the chamber 1 and then is mounted on the susceptor 11. Next, a plasma gas, e.g., Ar gas, is introduced from the plasma gas supply source 27 into the chamber 1 via the line 28 and the plasma gas introducing member 26 while introducing a microwave from the microwave plasma source 2 into the chamber 1. Accordingly, a plasma is generated.

After the plasma is generated, the processing gas, e.g., an etching gas such as $Cl_2$ gas or the like, is discharged from the processing gas supply source 25 into the chamber 1 via the line 24 and the shower plate 20. The discharged processing gas is excited by the plasma that has passed through the spaces 23 of the shower plate 20, and then is turned into a plasma or radicals. The plasma or the radicals of the processing gas is used to perform plasma processing, e.g., etching, on the wafer.

In the microwave plasma source 2, the microwave oscillated by the microwave oscillator 32 of the microwave output section 30 is amplified by the amplifier 33, and then is distributed by the divider 34. The distributed microwave is transmitted to the microwave introducing section 40 via the microwave supply section 50. In order to supply a sufficient power to the microwave introducing mechanism 41 serving as the microwave introducing section 40, microwave powers are outputted from the two amplifier units 42 into the main body 51 via the coaxial lines 56 and the two microwave power introduction ports 55 and the two power feed antenna 58 of the power feed/power combining unit 54 and are combined. Accordingly, the power combination can be simply achieved while suppressing heat generation. When sufficient power is supplied from a single amplifier unit 42, the power combining can be omitted. Alternatively, it is also possible to provide three or more microwave power introduction ports 55 and combine powers from three or more amplifier units 42.

The impedance is automatically matched by the tuner 60 of the microwave introducing mechanism 41, and the microwave power is radiated into the chamber 1 via the planar slot antenna 81 and the ceiling plate 83 of the antenna unit 80 without the substantial power reflection.

The microwave is distributed to the amplifier units 42, individually amplified by the main amplifier 47 serving as a solid state amplifier, radiated into the chamber 1 via the planar slot antenna 81, and then combined in the chamber 1. This makes a large-sized isolator or combiner unnecessary.

The microwave introducing mechanism 41 has a structure in which the antenna unit 80 and the tuner 60 are provided in the main body 51, which is extremely compact. Hence, the microwave plasma source 2 itself can become compact. The main amplifier 47, the tuner 60 and the planar slot antenna 81 are arranged close to each other. Especially, the tuner 60 and the planar slot antenna 81 can be constituted by a lumped constant circuit. Therefore, by setting the combined resistance of the planar slot antenna 81, the wave retardation member 82 and the ceiling plate 83 to be about 50Ω, the plasma load can be tuned with high accuracy by the tuner 60. The tuner 60 is constituted as a slug tuner capable of performing impedance matching simply by moving the two slugs 61a and 61b, which ensures compact size and low loss.

As described above, the tuner 60 and the planar slot antenna 81 are located close to each other. They form a lumped constant circuit and serves as a resonator. Therefore, the impedance mismatching up to the planar slot antenna 81 can be eliminated with high accuracy, and the mismatching occurs substantially in a plasma space, if any. Accordingly, the plasma can be controlled with high accuracy by the tuner 60.

By shifting the phase of each microwave introduction mechanism by using the phase shifter 45, a directivity of the microwave can be controlled, and the distribution of the plasma or the like can be easily adjusted.

As described above, a main body portion of the tuner has a compact size. Conventionally, the drive mechanism for driving the slugs to perform impedance matching is provided outside the main body portion of the tuner. The drive mechanism consists of a drive part such as a motor or the like, a drive transmission part such as a ball screw or the like, and a holding part such as a bracket or the like which are large in size. Accordingly, the outer conductor needs to be provided with a large-sized slit through which the holding part passes. This leads to requirement for a large-sized shield mechanism for preventing leakage of electromagnetic waves through the slit. Consequently, the scaling up of the tuner cannot be avoided as long as the drive mechanism and the shield mechanism are included.

With the present embodiment, the components corresponding to the drive transmission part, the drive guide part and the holding part are provided within the inner conductor 53. Thus, the weight and the moment of the mechanical elements can be reduced compared to the case of providing them outside the outer conductor 52. Further, it is not required to provide a slit for allowing the holding part to pass therethrough at the outer conductor 52, and a shield mechanism for preventing leakage of electromagnetic waves becomes unnecessary. Accordingly, the drive mechanism of the slugs 61a and 61b can be scaled down compared to a conventional one and, further, the entire tuner 60 can be scaled down.

The sliding members 63 made of a resin having sliding properties are attached to the slugs 61a and 61b, and a screw mechanism is formed in which the slug moving axle 64a or 64b is screw-coupled to the screw holes 65a of the sliding members 63. Then, by rotating the slug moving axles 64a and 64b by the motors 73a and 73b, the outer peripheries of the sliding members 63 are guided to slide along the inner periphery of the inner conductor 53 such that the slugs 61a and 61b are moved. Thus, the sliding members 63 and the slug moving axles 64a and 64b can perform three functions of the drive transmission part, the drive guide part and the holding part. As a consequence, the drive mechanism becomes considerably compact, and the tuner can be further scaled down.

The sliding member 63 is provided with a through hole 65b, and a slug moving axle that is not screw-coupled to the screw hole 65a passes through the through hole 65b. Therefore, two slug moving axles 64a and 64b for driving the slugs 61a and 61b, respectively, can be provided in the inner conductor 53, and the two slugs 61a and 61b can be individually moved by the screw mechanism. In the slug driving unit 70, the motors 73a and 73b and the gears 72a and 72b serving as the power transmission unit are vertically offset. Therefore, the space for the power transmission unit such as motors, gears or the like can be reduced, and the housing 71 for accommodating them can have the same diameter as that of the outer conductor 52. As a result, the tuner 60 can become more compact.

Since the slugs 61a and 61b move along the inner conductor 53 by the sliding member 63 sliding on the inner conductor 53, the movement load thereof is small. Therefore, the slug moving axles 64a, 64b may have trapezoidal screws of a low cost. The decrease in the position accuracy of the screws due to the backlash can be avoided by providing a lifting unit such as a coil spring or the like.

Since the positions of the slugs 61*a* and 61*b* are detected by the incremental encoders 75*a* and 75*b* directly coupled to the output axles of the motors 73*a* and 73*b*, a conventional position detection sensor becomes unnecessary. Further, it is possible to prevent the system from becoming complex and scaled up due to the installation space of the sensor. Furthermore, since the cost of the incremental encoders is lower than that of absolute encoders, a small-sized tuner with high accuracy can be realized without increasing the cost.

Meanwhile, the inner conductor 53 is provided with slits 53*a* for allowing the movement of the protrusions 63*a* of the sliding member 63. The power loss may occur due to the leakage of the electromagnetic wave from the slits 53*a* into the inner conductor 53. However, the leakage of the microwave power into the inner conductor 53 can be substantially prevented by setting the width of the slits 53*a* to be about 5 mm or less. Moreover, the radiation efficiency of the microwave power can be maintained at a high level.

In this regard, the simulation result will be described. Here, the loss of the input microwave power in the case of using an inner conductor having slits of various widths was measured by electromagnetic wave analysis using a finite elements method. In this simulation, a single microwave introduction port was provided. A parameter S11 was measured when the width of the slits is set to be about 0 mm, 3 mm, 5 mm, 6.6 mm, 10 mm, and 13.3 mm. S11 indicates reflection of the electromagnetic wave inputted from the microwave introducing port. When S11 is zero, it indicates that the loss caused by the reflection is zero. When S11 is 1, it indicates that all of the electromagnetic waves are reflected. As a result, when the slit widths were about 0 mm, 3 mm and 5 mm, S11 was about 0.087, 0.087 and 0.083, respectively.

In other words, when the slit width was smaller than or equal to about 5 mm, S11 was smaller than about 0.1, which indicates that the loss caused by reflection is almost zero. Meanwhile, when the slit widths were 6.6 mm, 10.0 mm, and 13.3 mm, S11 was 0.103, 0.162, and 0.258, respectively. When the slit width was greater than about 5 mm, loss by reflection was abruptly increased. This result shows that the leakage of the microwave power into the inner conductor 53 can be substantially prevented by setting the width of the slits 53*a* to be smaller than or equal about 5 mm.

As described above, in accordance with the present embodiment, the drive mechanism for moving the slugs 61*a* and 61*b* includes the drive part (the motors 73*a* and 73*b* and the like) for applying a driving force, the drive transmission part for transmitting the driving force from the drive part to the slugs 61*a* and 61*b*, the drive guide part for guiding the movement of the slugs, and the holding part for holding the slugs 61*a* and 61*b* at the drive transmission part. Since they are accommodated inside the inner conductor 53, the weight and the moment of the mechanical elements can be reduced compared to the case of providing them outside the outer conductor 52. Further, it is not required to provide the slit for allowing the movement of the holding part at the outer conductor 52. Moreover, a shield mechanism for preventing leakage of electromagnetic wave becomes unnecessary. Therefore, the slug driving unit can be scaled down compared to the conventional one and, further, the entire tuner can be scaled down.

As for the drive mechanism, there are provided the sliding members 63 which are inserted into the slugs 61*a* and 61*b*, sliding along the inner periphery of the inner conductor 53 while being in contact with the inner periphery of the inner conductor 53, and having screw holes; and the slug moving axles 64*a* and 64*b*, extended along the inner conductor 53, and formed as screw rods screwed-coupled to the screw holes of the sliding members of the slugs 61*a* and 61*b*.

The drive transmission part serving as a screw mechanism is constituted by the moving axles 64*a* and 64*b* and the sliding members 63; the drive guide part serving as a sliding guide mechanism is constituted by the sliding members 63 and the inner peripheral surface of the inner conductor 53; and the holding part is formed by the sliding members 63. Therefore, only the sliding members 63 and the slug moving axles 64*a* and 64*b* are provided inside the inner conductor, and they serve as the drive transmission part, the drive guide part and the holding part. This makes the drive mechanism considerably compact, and the tuner further scaled-down.

The present invention is not limited to the above embodiments, and can be variously modified within the scope of the present invention. For example, the circuit configurations of the microwave output section 30, the microwave introducing section 40, the main amplifier 47 and the like are not limited to those described in the above embodiments.

To be specific, the phase shifter becomes unnecessary when it is not required to control the directivity of the microwave radiated from the planar slot antenna or to obtain the circular polarized waves. Moreover, the microwave introducing section 40 does not necessarily include a plurality of microwave introducing mechanisms 41, and a single microwave introducing mechanism 41 may be provided.

Although the case in which the planar slot antenna 81 has two or four fan-shaped slots 81*a* has been described, various slot patterns can be employed if necessary without being limited to the above-described slot pattern. Further, the above embodiments have described an example in which two slugs are provided. Further, the number of the slugs may be more than two. When a tuning range is restricted in advance, a single slug may be provided.

Although the above-described embodiments employ as a slug driving unit a screw mechanism in which slug moving axles having trapezoidal screw threads are screw-coupled to sliding members, the present invention is not limited thereto. As screw threads, it is possible to use triangular screw threads, angular screw threads, saw-toothed screw threads or the like. Further, the slug moving axles and the sliding members are not necessarily directly screw-coupled to each other, and may also be screw-coupled to each other by using a ball screw.

As for the drive transmission mechanism, another mechanism such as a gear mechanism, a belt mechanism or the like may be used. The drive guide mechanism is not limited to the sliding mechanism, and may also be another guide such as LM guide or the like. Besides, the power transmission between the motors and the slug moving axles may be performed by a belt mechanism or the like other than the gear mechanism.

Although the present invention is applied to an etching apparatus as an example of a plasma processing apparatus in the above embodiments, it is not limited thereto. The present invention may be applied to another plasma processing apparatus for performing film formation, oxynitride film processing, ashing, or the like. Further, the object to be processed is not limited to the semiconductor wafer W, and may be another substrate such as a substrate for use in a flat panel display (FPD) represented by a liquid crystal display (LCD), a ceramic substrate or the like.

What is claimed is:
1. A tuner, provided in a microwave transmission path for transmitting a microwave from a microwave power source to a chamber for performing a microwave plasma process, for matching an impedance of a load in the chamber to a characteristic impedance of the microwave power source, the tuner comprising:
- a body having a tubular outer conductor and a tubular inner conductor coaxially provided in the outer conductor, the body forming a part of the microwave transmission path;
- an annular dielectric slug provided between the outer conductor and the inner conductor, the slug being movable along a longitudinal direction of the inner conductor; and
- a drive mechanism for moving the slug,
- wherein the drive mechanism comprises:
- a drive part for applying a driving force;
- a drive transmission part for transmitting the driving force from the drive part to the slug;
- a drive guide part for guiding movement of the slug; and
- a holding part for holding the slug at the drive transmission part,
- wherein the drive transmission part, the drive guide part and the holding part are accommodated in the inner conductor.

2. The tuner of claim 1, wherein the drive mechanism includes:
- a sliding member inserted into the slug, the sliding member being slidable along the inner conductor while being in contact with an inner peripheral surface of the inner conductor, the sliding member having a screw hole; and
- a slug moving axle provided inside the inner conductor along the longitudinal direction thereof, the slug moving axle serving as a screw rod screw-coupled to the screw hole of the sliding member of the slug,
- wherein the drive transmission part is a screw mechanism constituted by the slug moving axle and the sliding member; the drive guide part is a sliding guide mechanism constituted by the sliding member and the inner peripheral surface of the inner conductor; the holding part is formed by the sliding member; and the drive part has a motor for rotating the slug moving axle,
- wherein the slug held by the sliding member is driven by rotating the slug moving axle by the motor in a state where the sliding member is guided to slide on the inner peripheral surface of the inner conductor.

3. The tuner of claim 2, wherein the sliding member is made of a resin having sliding properties.

4. The tuner of claim 2, wherein at least two slugs in which the sliding member is inserted are provided; and at least two slug moving axles and motors corresponding to the slugs are provided, and wherein the sliding member has a through hole through which the slug moving axle screw-coupled to another slug passes.

5. The tuner of claim 4, wherein said at least two motors are offset-arranged along the movement direction of the slugs.

6. The tuner of claim 2, further comprising an incremental encoder, provided at an output axle of the motor, for detecting a position of the slug based on a starting point of the slug, wherein the starting point is determined by detecting the position of the slug where a count of the encoder is unchanged when the slug reaches a mechanical stop and the motor stops.

7. The tuner of claim 2, wherein the inner conductor has slits for allowing movement of connecting portions between the sliding member and the slug, and the slits have a width of about 5 mm or less.

8. A microwave plasma source comprising:
- a microwave power source;
- a microwave transmission path which transmits a microwave from the microwave power source to a chamber for performing a plasma process on a substrate;
- a tuner provided in the microwave transmission path for matching an impedance of a load in the chamber to a characteristic impedance of the microwave power source; and
- an antenna unit for generating a plasma by radiating the microwave into the chamber,
- wherein the tuner includes:
- a body having a tubular outer conductor and a tubular inner conductor coaxially provided in the outer conductor, the body forming a part of the microwave transmission path;
- an annular dielectric slug provided between the outer conductor and the inner conductor, the slug being movable along a longitudinal direction of the inner conductor; and
- a drive mechanism for moving the slug,
- wherein the drive mechanism comprises:
- a drive part for applying a driving force;
- a drive transmission part for transmitting the driving force from the drive part to the slug;
- a drive guide part for guiding movement of the slug; and
- a holding part for holding the slug at the drive transmission part,
- wherein the drive transmission part, the drive guide part and the holding part are accommodated in the inner conductor.

9. The microwave plasma source of claim 8, wherein the drive mechanism includes:
- a sliding member inserted into the slug, the sliding member being slidable along the inner conductor while being in contact with an inner peripheral surface of the inner conductor, the sliding member having a screw hole; and
- a slug moving axle provided inside the inner conductor along the longitudinal direction thereof, the slug moving axle serving as a screw rod screw-coupled to the screw hole of the sliding member of the slug,
- wherein the drive transmission part is a screw mechanism constituted by the slug moving axle and the sliding member; the drive guide part is a sliding guide mechanism constituted by the sliding member and the inner peripheral surface of the inner conductor; the holding part is formed by the sliding member; and the drive part has a motor for rotating the slug moving axle,
- wherein the slug held by the sliding member is driven by rotating the slug moving axle by the motor in a state where the sliding member is guided to slide on the inner peripheral surface of the inner conductor.

10. The microwave plasma source of claim 8, wherein the antenna unit is formed as one unit with the tuner.

* * * * *